(12) United States Patent
DeBoer et al.

(10) Patent No.: US 6,282,080 B1
(45) Date of Patent: *Aug. 28, 2001

(54) SEMICONDUCTOR CIRCUIT COMPONENTS AND CAPACITORS

(75) Inventors: Scott Jeffrey DeBoer, Boise; F. Daniel Gealy, Kuna; Randhir P. S. Thakur, Boise, all of ID (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 19 days.

This patent is subject to a terminal disclaimer.

(21) Appl. No.: 09/229,518

(22) Filed: Jan. 13, 1999

Related U.S. Application Data

(63) Continuation of application No. 08/916,771, filed on Aug. 20, 1997, now Pat. No. 5,910,880.

(51) Int. Cl.[7] .............................. H01G 4/06; H01G 4/20
(52) U.S. Cl. ................ 361/311; 361/313; 361/321.5; 251/296
(58) Field of Search ............................ 361/311, 312, 361/313, 322, 321.1–321.5, 303, 305; 257/296–311

(56) References Cited

U.S. PATENT DOCUMENTS

| | | |
|---|---|---|
| 4,333,808 | 6/1982 | Bhattacharyxa et al. . |
| 4,464,701 | 8/1984 | Roberts et al. ................ 361/313 |
| 4,891,682 | 1/1990 | Yusa et al. . |

(List continued on next page.)

FOREIGN PATENT DOCUMENTS

| | | |
|---|---|---|
| 1-222469 A | 5/1989 | (JP) . |
| 05-221644 | 8/1993 | (JP) . |
| 405343641 | 12/1993 | (JP) ................................. 257/310 |
| 06-021333 | 1/1994 | (JP) . |
| 09/033064 | 2/1998 | (WO) . |
| 09/058612 | 4/1998 | (WO) . |
| 09/059057 | 4/1998 | (WO) . |
| 09/074638 | 5/1998 | (WO) . |
| 09/083257 | 5/1998 | (WO) . |
| 09/086389 | 5/1998 | (WO) . |
| 09/098035 | 6/1998 | (WO) . |
| 09/122473 | 7/1998 | (WO) . |
| 09/137780 | 8/1998 | (WO) . |
| 09/185412 | 11/1998 | (WO) . |

OTHER PUBLICATIONS

Anonymous Research Disclosure, 1989R D–0299041 titled "Double High Dielectric Capacitor", Derewent–Week 198917 (Derwent World Patent Index), (Mar. 10, 1989).

H. Shinriki and M. Nakata, *IEEE Transaction On Electron Devices* vol. 38 No. 3 Mar. 1991.

(List continued on next page.)

*Primary Examiner*—Anthony Dinkins
(74) *Attorney, Agent, or Firm*—Wells, St. John, Roberts, Gregory & Matkin, P.S.

(57) ABSTRACT

The invention pertains to semiconductor circuit components and capacitors. In another aspect, the invention includes a capacitor including: a) a first capacitor plate; b) a first tantalum-comprising layer over the first capacitor plate; c) a second tantalum-comprising layer over the first tantalum-comprising layer, the second tantalum-comprising layer having nitrogen; and d) a second capacitor plate over the second tantalum-comprising layer. In another aspect, the invention includes a component having: a) a first tantalum-comprising layer; and b) a second tantalum-comprising layer over the first tantalum-comprising layer, the second tantalum-comprising layer having nitrogen.

20 Claims, 2 Drawing Sheets

U.S. PATENT DOCUMENTS

| | | | |
|---|---|---|---|
| 4,952,904 | 8/1990 | Johnson et al. . | |
| 5,053,917 | 10/1991 | Miyasaka et al. | 361/321 |
| 5,079,191 | 1/1992 | Shinriki et al. . | |
| 5,111,355 * | 5/1992 | Anand et al. | 361/313 |
| 5,142,438 | 8/1992 | Reinberg et al. . | |
| 5,191,510 | 3/1993 | Huffman | 361/313 |
| 5,234,556 | 8/1993 | Oishi et al. . | |
| 5,279,985 | 1/1994 | Kamiyama . | |
| 5,293,510 | 3/1994 | Takenaka | 257/295 |
| 5,316,982 | 5/1994 | Taniguchi . | |
| 5,330,935 | 7/1994 | Dobuzinsky et al. . | |
| 5,335,138 | 8/1994 | Sandhu et al. . | |
| 5,348,894 | 9/1994 | Gnade et al. . | |
| 5,352,623 | 10/1994 | Kamiyama . | |
| 5,362,632 | 11/1994 | Mathews . | |
| 5,372,859 | 12/1994 | Thakoor . | |
| 5,442,213 | 8/1995 | Okudaira | 255/854 |
| 5,466,629 | 11/1995 | Mihara et al. . | |
| 5,468,687 | 11/1995 | Carl et al. . | |
| 5,471,364 | 11/1995 | Summerfelt et al. | 361/321.4 |
| 5,504,041 | 4/1996 | Summerfelt | 437/235 |
| 5,508,953 | 4/1996 | Fukuda et al. | 365/145 |
| 5,510,651 | 4/1996 | Maniar et al. . | |
| 5,552,337 | 9/1996 | Kwon et al. . | |
| 5,555,486 | 9/1996 | Kingon et al. . | |
| 5,561,307 | 10/1996 | Mihara et al. | 257/295 |
| 5,585,300 | 12/1996 | Summerfelt . | |
| 5,641,702 | 6/1997 | Imai et al. | 438/396 |
| 5,654,222 | 8/1997 | Sandhu et al. | 438/3 |
| 5,663,088 | 9/1997 | Sandhu et al. | 438/396 |
| 5,668,040 | 9/1997 | Byun . | |
| 5,688,724 | 11/1997 | Yoon et al. . | |
| 5,728,603 | 3/1998 | Emesh et al. . | |
| 5,741,626 | 4/1998 | Jain et al. | 430/314 |
| 5,780,359 | 7/1998 | Brown et al. . | |
| 5,786,248 | 7/1998 | Schuergraf | 438/240 |
| 5,790,366 | 8/1998 | Desu et al. | 361/305 |
| 5,798,903 | 8/1998 | Dhote et al. | 361/321.4 |
| 5,814,852 | 9/1998 | Sandhu et al. . | |
| 5,837,591 | 11/1998 | Shimada et al. | 438/381 |
| 5,837,593 | 11/1998 | Park et al. . | |
| 5,838,035 | 11/1998 | Ramesh . | |
| 5,843,830 | 12/1998 | Graettinger et al. . | |
| 5,844,771 | 12/1998 | Graettinger et al. . | |
| 5,872,696 * | 2/1999 | Peters et al. | 361/305 |
| 5,899,740 | 5/1999 | Kwon | 438/627 |
| 5,910,218 | 6/1999 | Park et al. | 118/719 |
| 5,916,634 | 6/1999 | Fleming et al. | 427/255.2 |
| 5,919,531 | 7/1999 | Arkles et al. | 427/576 |
| 5,930,584 | 7/1999 | Sun et al. | 438/3 |
| 5,933,316 | 8/1999 | Ramakrishnan et al. | 361/311 |

OTHER PUBLICATIONS

Kamiyama, S., et al., "Highly Reliable 2.5nm $Ta_2O_5$ Capacitor Process Technology for 256Mbit DRAMs", (No Month) 1991 IEEE, pp. 827–830.

Kamiyama, S., et al., "Ultrahin Tantalum Oxide Capacitor Dielectric Layers Fabricated Using Rapid Thermal Nitridation prior to Low PressureChemical Vapor Deposition", *J. Electron. Soc.*, vol. 140, No. 6, Jun. 1993, pp. 1617–1625.

Farooq, M.A., et al., Tantalum nitride as a diffusion barrier between $Pd_2Si$, $CoSi_2$ and aluminum, *J. Appl. Phys.* 65 (8) Apr. 1989, pp. 3017–3022.

U.S. application No. 08/944,054, Patekh et al., filed Dec. 1997.

Fazan, P.C. et al., "A High–C Capacitor (20.4fF/$\mu m^2$) with Ultrathin CVD–$Ta_2O_5$ Films Deposited on Rugged Poly–Si for High Density DRAMs", (No Month) 1992 IEEE, pp. 263–266.

Lesaicherre, P–Y, et al., "A Gbit–Scale DRAM Stacked Capacitor Technology with ECR MOCVD $SrTiO_3$ and RIE Patterned $RuO_2$/TiN Storage Nodes", (No Month) 1994 IEEE, pp. 831–834.

Yamaguchi, H., et al., "Structural and Electrical Characterization of $SrTiO_3$ Thin Films Prepared by Metal Organic Chemical Vapor Deposition", *Jpn. J. Appl. Phys.* vol. 32 (Jul. 1993), Pt. 1, No. 9B, pp. 4069–4073.

Eimori, T., et al., "A Newly Designed Planar Stacked Capacitor Cell with High dielectric Constant Film for 256Mbit DRAM", (No Month) 1993 IEEE, pp. 631–634.

09/033,063 Filed Feb. 1998 Al–Shareef et al.
08/670,644 Filed Jun. 1996 Graettinger.
08/916,771 Filed Aug. 1997 DeBoer et al.
08/881,561 Filed Jun. 1997 Sandhu et al.
08/858027 Filed May 1997 Sandhu et al.
08/738,789 Filed Oct. 1996 Sandhu et al.
09/185,412 Filed Nov. 1998 Graettinger et al.
09/137,780 Filed Aug. 1998 Al–Shareef.
09/122,473 Filed Jul. 1998 Schuegraf.
09/098,035 Filed Jun. 1998 Deboer et al.
09/086,389 Filed May 1998 Sandhu et al.
09/083,257 Filed May 1998 Al–Shareef.
09/074,638 Filed May 1998 Agarwal et al.
09/059,057 Filed Apr. 1998 Agarwal et al.
09/058,612 Filed Apr. 1998 Agarwal et al.
09/033,064 Filed Feb. 1998 Al–Shareef.

McIntyre, Paul C. et al., *Kinetics and Mechanics of TiN Oxidation Beneath Pt/TiN Films*, J. Appl. Phys., vol. 82, No. 9, pp. 4577–4585 (Nov. 1997).

Onishi, Shiego et al., *A Half–Micron Ferroelectric Memory Cell Technology with Stacked Capacitor Structure*, I.E.E.E., IDEM 94–843, pp. 843–846 (1994).

Wolf, Stanley, *Silicon Processing for the VLSI Era*, pp. 589–591, (No Month) (1990).

* cited by examiner

SEMICONDUCTOR CIRCUIT COMPONENTS AND CAPACITORS

RELATED PATENT DATA

This is a continuation application of U.S. patent application Ser. No. 08/916,771, which was filed on Aug. 20, 1997 now U.S. Pat. No. 5,910,880.

TECHNICAL FIELD

The invention pertains to semiconductor circuit components and capacitors, and to methods of forming capacitors and semiconductor circuit components.

BACKGROUND OF THE INVENTION

Tantalum pentoxide ($Ta_2O_5$) is a desired capacitor dielectric material due to its high dielectric constant of about 25. In contrast, other commonly utilized dielectric materials have much lower dielectric constants. For instance, silicon nitride has a dielectric constant of about 8 and silicon dioxide has a dielectric constant of about 4. Due to the high dielectric constant of $Ta_2O_5$, a thinner layer of $Ta_2O_5$ can be utilized in capacitor constructions to achieve the same capacitance as thicker layers of other materials.

Semiconductive capacitors comprise a first conductive plate and a second conductive plate, with a dielectric layer formed between the plates. Commonly, the conductive plates comprise doped polysilicon, with one or both of the plates comprising a rugged form of polysilicon, such as, for example, hemispherical grain polysilicon.

It is highly desired to utilize $Ta_2O_5$ as the dielectric layer due to the dielectric properties discussed above. Unfortunately, the chemical vapor deposition (CVD) processes by which $Ta_2O_5$ is formed adversely complicate its incorporation into semiconductive capacitors. For instance, $Ta_2O_5$ is not typically deposited onto a first polysilicon plate, nor is a second polysilicon plate typically directly deposited onto $Ta_2O_5$. The CVD processes by which $Ta_2O_5$ is formed adversely affect underlying and overlying polysilicon layers unless such polysilicon layers are first protected with barrier layers. Specifically, $Ta_2O_5$ is typically formed by a CVD process in which $Ta(OC_2H_5)_5$ and oxygen are combined. Unless a polysilicon plate is protected by a barrier layer before such CVD deposition over the polysilicon, the oxygen of the CVD process will react with the polysilicon to disadvantageously form a layer of silicon dioxide over the polysilicon. Present methods for protecting the polysilicon include provision of a silicon nitride layer over the polysilicon prior to formation of $Ta_2O_5$. The silicon nitride layer is typically 10 to 20 angstroms thick. Also, unless a $Ta_2O_5$ layer is first covered with a barrier layer before formation of polysilicon over the $Ta_2O_5$ layer, the polysilicon will react with oxygen in the $Ta_2O_5$ layer to disadvantageously form silicon dioxide.

An example prior art process for forming a capacitor 10 having a $Ta_2O_5$ dielectric layer is illustrated in FIG. 1. A polysilicon first capacitor plate 12 is formed over a substrate 14. A silicon nitride layer 16 is formed over polysilicon layer 12. A $Ta_2O_5$ dielectric layer 18 is formed over silicon nitride layer 16 by the above-described CVD process. After the CVD of $Ta_2O_5$ layer 18, the layer is typically subjected to an anneal in the presence of an oxygen ambient. The anneal drives any carbon present in layer 18 out of the layer and advantageously injects additional oxygen into layer 18 such that the layer uniformly approaches a stoichiometry of five oxygen atoms for every two tantalum atoms. The oxygen anneal is commonly conducted at a temperature of from about 400° C. to about 1000° C. utilizing an ambient comprising an oxygen containing gas. The oxygen containing gas commonly comprises one or more of $O_3$, $N_2O$ and $O_2$. The oxygen containing gas is typically flowed through a reactor at a rate of from about 0.5 slm to about 10 slm.

$Ta_2O_5$ layer 18 is typically from about 40 angstroms to about 150 angstroms thick and can be either amorphous or crystalline. It is noted that $Ta_2O_5$ is generally amorphous if formed below 600° C. and will be crystalline if formed, or later processed, at or above 600° C. Typically, a $Ta_2O_5$ layer is deposited as an amorphous layer and the above-described oxygen anneal is conducted at a temperature of 600° C. or greater to convert the amorphous $Ta_2O_5$ layer to a crystalline layer.

A second nitride layer 20 is deposited over $Ta_2O_5$ layer 18. Second nitride layer 20 typically comprises TiN or WN. A second capacitor plate 22 is formed over nitride layer 20. Second capacitor plate 22, like first capacitor plate 12, typically comprises doped polysilicon or doped rugged polysilicon. It is noted that the top electrode of the $Ta_2O_5$ capacitor can comprise only TiN or WN layer 20, or can comprise the layer 20 and layer 22 stack.

The formation of layer 20 is typically done by a chemical vapor deposition process, as opposed to a sputtering type process, to achieve acceptable conformity in high aspect ratio capacitor devices. Such CVD processes use either metal organic precursors or organometallic precursors. Either precursor contains carbon and results in the deposition of a barrier layer 20 which typically includes large amounts of carbon, commonly from about 10 to about 15 volume percent, and sometimes as much as 30 volume percent. Although such carbon typically does not adversely impact the function or conductivity of the nitride layer 20, subsequent wafer processing can cause carbon from layer 20 to diffuse into $Ta_2O_5$ layer 18. Carbon diffusing into $Ta_2O_5$ layer 18 can disadvantageously cause layer 18 to leak current, and in extreme cases can convert an intended capacitor device 10 into a device that behaves more like a resistor than a capacitor.

An additional disadvantage that can occur during placement of a nitride barrier layer 20 over $Ta_2O_5$ layer 18 is that there is typically some formation of the undesired compound $TiO_2$ at an interface between $Ta_2O_5$ layer 18 and barrier layer 20.

It would be desirable to develop alternative methods of utilizing $Ta_2O_5$ in integrated circuit construction.

SUMMARY OF THE INVENTION

In one aspect, the invention encompasses methods of forming a dielectric layer. A first tantalum-comprising layer is formed and a second tantalum-comprising layer is formed over the first tantalum-comprising layer. The second tantalum-comprising layer comprises nitrogen.

In another aspect, the invention encompasses a method of forming a capacitor. A first capacitor plate is formed and a first layer is formed over the first capacitor plate. The first layer comprises tantalum oxide. A second layer is formed over the first layer. The second layer comprises tantalum and nitrogen. A second capacitor plate is formed over the second layer.

In another aspect, the invention encompasses a method of forming a capacitor. A first capacitor plate is formed. A first layer is formed over the first capacitor plate. The first layer comprises tantalum and oxygen, and is substantially void of carbon. A barrier layer is formed over the first layer. A metal nitride layer is formed over the barrier layer. A second capacitor plate is formed over the metal nitride layer. The metal nitride layer is processed at a sufficient temperature to diffuse carbon from the metal nitride layer. The barrier layer substantially prevents the diffused carbon from permeating into the first layer.

In another aspect, the invention encompasses a semiconductor circuit component comprising a first tantalum-comprising layer and a second tantalum-comprising layer over the first tantalum-comprising layer. The second tantalum-comprising layer comprises nitrogen.

In another aspect, the invention encompasses a capacitor. The capacitor comprises a first capacitor plate and a first layer over the first capacitor plate. The first layer comprises tantalum and oxygen. The capacitor further includes a second layer over the first layer. The second layer comprises tantalum and nitrogen. Additionally, the capacitor includes a second capacitor plate over the second layer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
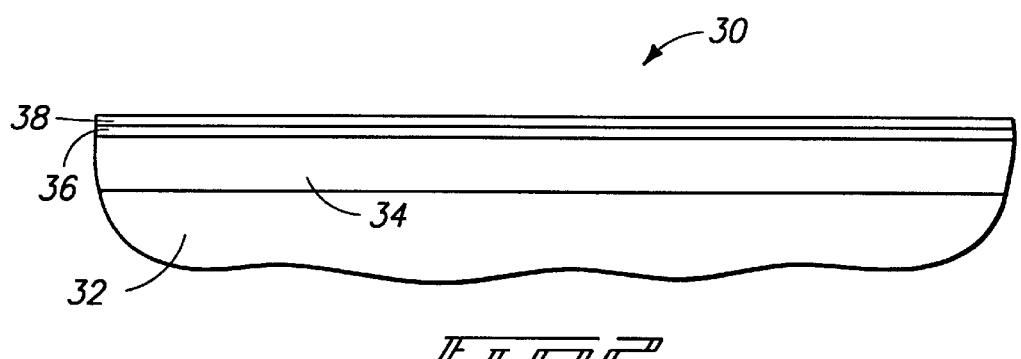
FIG. 2 is a fragmentary diagrammatic cross-sectional view of a semiconductor wafer fragment at a preliminary processing step of the present invention.

Semiconductor processing methods of the present invention are described with reference to FIGS. 2–5. Referring to FIG. 2, a semiconductor wafer fragment 30 is illustrated at a preliminary processing step in accordance with the present invention. Wafer fragment 30 comprises a substrate 32 upon which is formed a first capacitor plate 34. First capacitor plate 34 preferably comprise conductively doped polysilicon, and most preferably comprises conductively doped rugged polysilicon, such as, for example, hemispherical grain polysilicon. First capacitor plate 34 can be formed by conventional methods.

A nitride layer 36 is formed over first capacitor plate 34 and a tantalum-comprising layer 38 is formed over nitride layer 36. Tantalum-comprising layer 38 preferably comprises $Ta_2O_5$, and nitride layer 36 can comprise, for example, silicon nitride. Layers 34, 36 and 38 can be formed by conventional methods, such as, for example, the methods discussed above in the "Background Of The Invention"

section of this disclosure. In the context of the present invention, an additional tantalum-comprising layer will be formed over layer 38. Accordingly, layer 38 may be referred to as a first tantalum-comprising layer.

Figure 3:
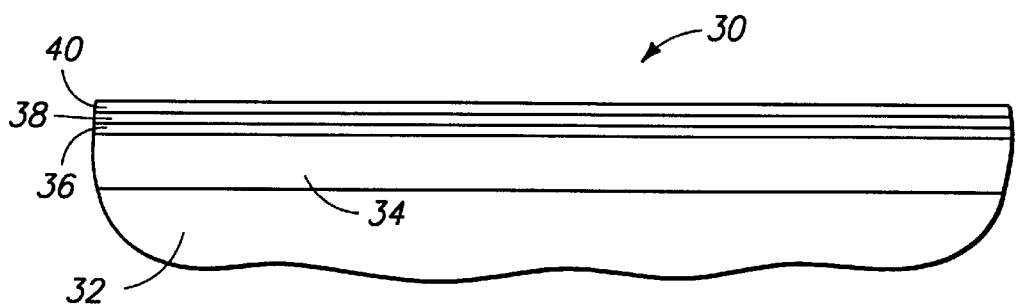
FIG. 3 is a fragmentary cross-sectional view of the FIG. 2 wafer fragment shown at a processing step subsequent to that of FIG. 2.

Referring to FIG. 3, a second tantalum-comprising layer 40 is formed over first tantalum-comprising layer 38. Second tantalum-comprising layer 40 is a barrier layer preferably comprising tantalum and nitrogen, such as in the form $Ta_2N$. Second tantalum-comprising layer 40 can additionally comprise oxygen, and may, for example, comprise a compound having the general formula $Ta_xO_yN_z$.

Second tantalum-comprising layer 40 can be formed by depositing a layer of $Ta_2N$, or $Ta_xO_yN_z$, over first tantalum-comprising layer 38. Alternatively, and more preferred, second tantalum-comprising layer 40 is formed by exposing an outer surface of first tantalum-comprising layer 38 to a nitrogen-comprising ambient. Such nitrogen-comprising ambient can, for example, comprise one or more gases selected from a group consisting of hydrazine, hydrazoic acid, ammonia and $NF_3$. Alternatively, the nitrogen-comprising ambient can consist essentially of hydrazine, can consist of essentially of hydrazoic acid, can consist essentially of ammonia, or can consist essentially of $NF_3$. The nitrogen-comprising gas preferably does not consist essentially of $N_2$. The exposure to the nitrogen-comprising ambient can utilize a plasma (rf, ECR or remote plasma) to generate an active nitrogen species. The plasma can contain the nitrogen-comprising ambient and a diluent such as, $N_2$, $H_2$, Ar, and/or He.

The above-described exposure of an outer surface of layer 38 to a nitrogen-comprising ambient preferably comprises an anneal of layer 38 at a temperature of from about 350° C. to about 900° C. The anneal typically comprises heating at least the exposed outer surface of layer 38 to such temperature. If the nitrogen-comprising ambient consists essentially of hydrazine, the annealing temperature is preferably from about 350° C. to about 600° C. If the nitrogen-comprising ambient consists essentially of ammonia, the annealing temperature is preferably from about 600° C. to about 900° C. It is noted that, as discussed above, $Ta_2O_5$ transforms from an amorphous material to a crystalline material at about 600° C. Accordingly, it may be desired to utilize a hydrazine-comprising gas for forming second tantalum-comprising layer 40 when it is desired to keep $Ta_2O_5$ layer 38 in an amorphous form. In contrast, it may be desired to utilize an ammonia-comprising gas when it is, desired to convert an amorphous $Ta_2O_5$ layer 38 to a crystalline form. Methods for exposing a wafer surface to hydrazine, ammonia, $NF_3$ and/or hydrazoic acid in a semiconductor processing reactor at the above-discussed temperatures are known to persons of ordinary skill in the art.

First tantalum-comprising layer 38 is preferably exposed to the nitrogen-comprising ambient for a time of from about 30 seconds to about 10 minutes. It is noted that the formation of second tantalum-comprising layer 40 from the interaction of the nitrogen-comprising ambient with first layer 38 will be a self-limiting process which will generally terminate by about 10 minutes. Second tantalum-comprising layer 40 will generally be less than or equal to about 20 angstroms thick at the termination of such process.

Figure 4:
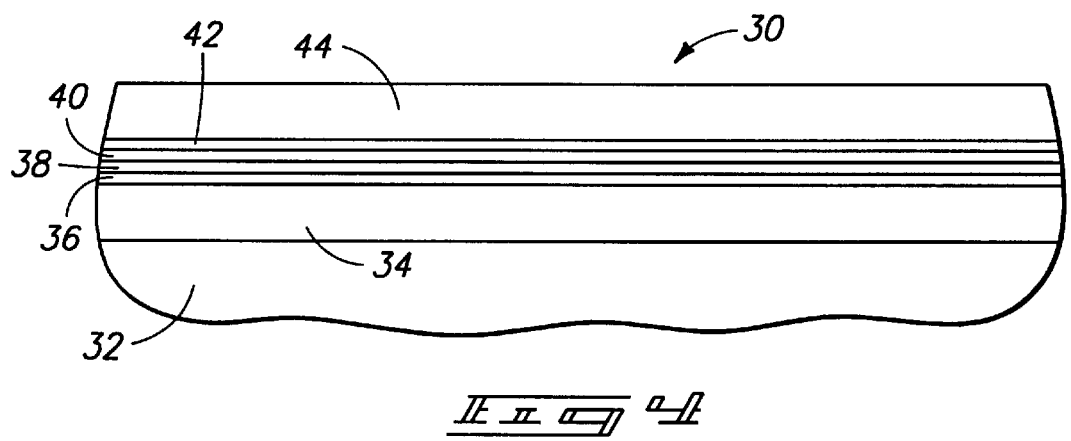
FIG. 4 is a fragmentary cross-sectional view of the FIG. 2 wafer fragment shown at a processing step subsequent to that of FIG. 3, in accordance with a first embodiment of the present invention
Figure 5:
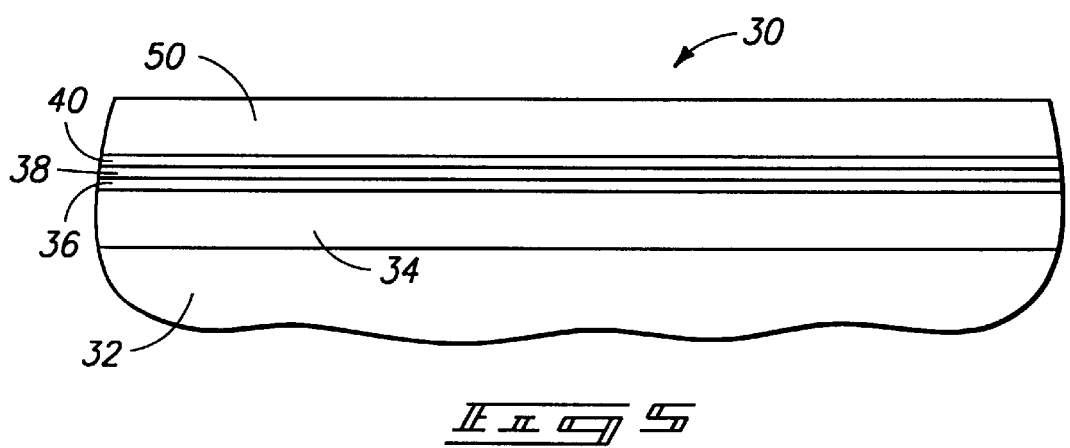
FIG. 5 is a fragmentary cross-sectional view of the FIG. 2 wafer fragment shown at a processing step subsequent to that of FIG. 3, in accordance with a second embodiment of the present invention.

FIGS. 4 and 5 illustrate alternative processing methods which can be utilized after formation of second tantalum-comprising layer 40. Referring to the first embodiment processing method of FIG. 4, a metal nitride layer 42 is formed over second tantalum-comprising layer 40. Metal nitride layer 42 can comprise materials known to persons of ordinary skill in the art, such as, for example, TiN or WN, and can be formed by conventional methods, such as, for example, CVD. Advantageously, if metal nitride layer 42 is formed by a CVD process, carbon present in such layer due to the CVD process will be prevented from diffusing into a $Ta_2O_5$ layer 38 by the barrier layer 40. Accordingly in contrast to prior art processes, $Ta_2O_5$ layer 38 will remain substantially void of carbon in spite of the provision of metal nitride layer 42 overlying $Ta_2O_5$ layer 38. A second capacitor plate 44 is formed over metal nitride layer 42. Second capacitor plate 44 can comprise, for example, conductively doped polysilicon. Second capacitor plate 44 can be formed by conventional processes.

Figure 1:
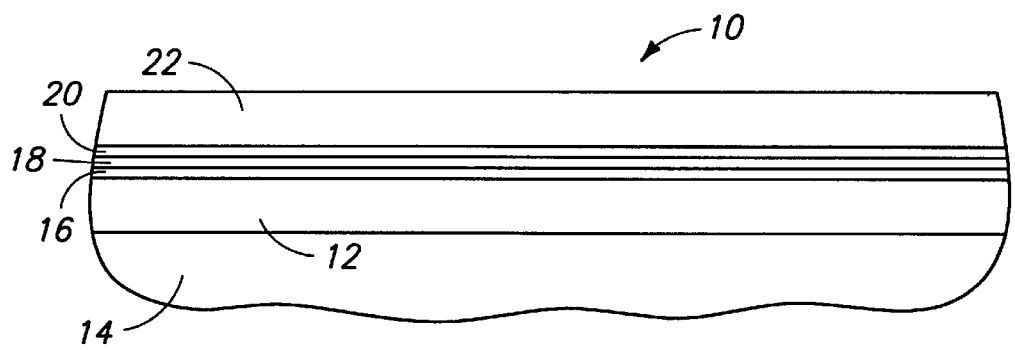
FIG. 1 is a fragmentary diagrammatic cross-sectional view of a semiconductor wafer fragment illustrating a prior art capacitor construction.

Referring to FIG. 5, a second embodiment process for completing a capacitor structure of the present invention is illustrated. In this embodiment, a second capacitor plate 50 is formed directly over second tantalum-comprising layer 40. Second capacitor plate 50 can comprise, for example, conductively doped polysilicon. Second tantalum-comprising layer 40 functions as a barrier layer between the polysilicon of layer 50 and the $Ta_2O_5$ of layer 38 to prevent an undesired formation of silicon dioxide between layers 50 and 38. Accordingly, barrier layer 40 permits polysilicon layer 50 to be directly deposited over a tantalum-comprising layer, in contrast to prior art processes wherein the polysilicon layer was formed over a non-tantalum-comprising metal nitride layer. It is; noted that tantalum-comprising barrier layer 40 not only prevents, diffusion of carbon from a metal nitride layer 42 into the $Ta_2O_5$ of layer 38, but also substantially prevents diffusion of oxygen from layer 38 into layers above tantalum-comprising layer 40. It is also noted that barrier layer 40 differs form the prior art barrier layer 20 (described above with reference to FIG. 1) in that barrier layer 40 is substantially void of carbon, i.e., comprises less than 10 volume percent of carborn and preferably less than about 5 volume percent.

The processing described above with reference to FIGS. 2–5 forms semiconductor circuit components comprising first tantalum-comprising layer 38 and an overlying second tantalum-comprising layer 40. Although the above described processing is directed toward capacitor, constructions, it is to be understood that such semiconductor circuit components can have application to other electrical structures, besides capacitors, in which a high-dielectric material is desired.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor circuit component comprising:
   a first tantalum-containing layer;
   a second tantalum-containing layer on the first tantalum-containing layer, the second tantalum-containing layer consisting of tantalum and nitrogen; and
   a layer comprising metal nitride on the second tantalum-comprising layer.

2. The semiconductor circuit component of claim 1 wherein the first tantalum-containing layer comprises oxygen.

3. The semiconductor circuit component of claim 1 wherein the first tantalum-containing layer comprises oxygen and is substantially void of carbon.

4. The semiconductor circuit component of claim 1 wherein the first tantalum-containing layer consists essentially of $Ta_2O_5$.

5. The semiconductor circuit component of claim 1 wherein the metal nitride is not TaN.

6. The semiconductor circuit component of claim 1 wherein the metal nitride is WN.

7. The semiconductor circuit component of claim 1 wherein the metal nitride is TiN.

8. A capacitor comprising:
   a first capacitor plate;
   a first tantalum-containing layer over the first capacitor plate;
   a second tantalum-containing layer over the first tantalum-containing layer, the second tantalum-containing layer consisting of tantalum and nitrogen;
   a layer comprising metal nitride over the second tantalum-comprising layer; and
   a second capacitor plate over the layer comprising metal nitride.

9. The capacitor of claim 8 wherein the metal nitride is WN.

10. The capacitor of claim 8 wherein the first tantalum-containing layer comprises oxygen.

11. The capacitor of claim 8 wherein the first tantalum-containing layer comprises oxygen and is substantially void of carbon.

12. The capacitor of claim 8 wherein the first tantalum-containing layer consists essentially of $Ta_2O_5$.

13. The capacitor of claim 8 wherein the metal nitride is not TaN.

14. The capacitor of claim 8 wherein the metal nitride is TiN.

15. A semiconductor circuit component comprising:
   a first tantalum-comprising layer over a substrate;
   a second tantalum-comprising layer on the first tantalum-comprising layer, the second tantalum-comprising layer consisting essentially of tantalum and nitrogen; and
   a layer comprising metal nitride on the second tantalum-comprising layer.

16. The semiconductor circuit component of claim 15 wherein the second tantalum-comprising layer is in contact with the first tantalum-comprising layer.

17. The semiconductor circuit component of claim 15 wherein the first tantalum-comprising layer comprises oxygen.

18. The semiconductor circuit component of claim 15 wherein the first tantalum-comprising layer consists essentially of $Ta_2O_5$.

19. A capacitor comprising:

a first capacitor plate over a substrate;

a first tantalum-comprising layer over the first capacitor plate;

a second tantalum-comprising layer on the first tantalum-comprising layer, the second tantalum-comprising layer consisting essentially of tantalum and nitrogen;

a layer comprising metal nitride over the second tantalum-comprising layer; and a second capacitor plate over the layer comprising metal nitride.

20. The capacitor of claim 19 wherein the substrate comprises a semiconductive wafer.

* * * * *

UNITED STATES PATENT AND TRADEMARK OFFICE
CERTIFICATE OF CORRECTION

PATENT NO. : 6,282,080 B1
DATED : August 28, 2001
INVENTOR(S) : Scott Jeffrey DeBoer et al It is certified that error appears in the above-identified patent and that said Letters Patent is hereby corrected as shown below:

Column 1,
Line 54, replace "$Ta_2o_5$" with -- $Ta_2 O_5$ --

Column 3,
Line 56, replace "comprise" with -- comprises --.

Column 4,
Line 46, replace "it is, desired" with -- it is desired --.

Column 5,
Line 28, replace "It is; noted" with -- It is noted --.
Line 29, replace "prevents, diffusion" with -- prevents diffusion --.
Line 44, replace "capacitor, constructions," with -- capacitor constructions, --.

Column 6,
Line 34, replace "comprising layer;" with -- containing layer; --.

Signed and Sealed this

Nineteenth Day of March, 2002

Attest:

JAMES E. ROGAN
Director of the United States Patent and Trademark Office

Attesting Officer